(12) United States Patent
Wang et al.

(10) Patent No.: US 8,388,221 B2
(45) Date of Patent: Mar. 5, 2013

(54) METHOD FOR DETECTING PERFORMANCES OF HEAT DISSIPATION MODULES

(75) Inventors: Feng-Ku Wang, Taipei (TW); Yi-Lun Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 452 days.

(21) Appl. No.: 12/748,809

(22) Filed: Mar. 29, 2010

(65) Prior Publication Data

US 2011/0122914 A1    May 26, 2011

(30) Foreign Application Priority Data

Nov. 25, 2009  (TW) ................................ 98140227 A

(51) Int. Cl.
  *G01N 25/00*  (2006.01)
  *G01K 7/00*  (2006.01)
(52) U.S. Cl. ......................................... 374/43; 374/183
(58) Field of Classification Search ................... 374/43, 374/183
  See application file for complete search history.

(56) References Cited

U.S. PATENT DOCUMENTS

| 6,663,278 | B1 * | 12/2003 | Chien et al. ..................... 374/43 |
| 7,304,848 | B2 * | 12/2007 | Chang ............................ 361/701 |
| 7,549,790 | B2 * | 6/2009 | Ye et al. .......................... 374/43 |
| 8,078,438 | B2 * | 12/2011 | Wang et al. ....................... 703/5 |
| 2007/0286256 | A1 * | 12/2007 | Liu et al. ....................... 374/147 |
| 2009/0281761 | A1 * | 11/2009 | Bandholz et al. .............. 702/132 |
| 2010/0278211 | A1 * | 11/2010 | Pu et al. .......................... 374/57 |

\* cited by examiner

*Primary Examiner* — Mirellys Jagan
(74) *Attorney, Agent, or Firm* — Morris Manning & Martin LLP; Tim Tingkang Xia, Esq.

(57) ABSTRACT

A corresponding relation between heat resistance values of first heat dissipation modules under a non-uniform heat source and heat resistance values of the first heat dissipation modules under a uniform heat source is described through a linear equation. Therefore, before second heat dissipation modules are tested, a calculation is performed with the linear equation, such that a target heat resistance value of the first heat dissipation modules arranged on the non-uniform heat source is corresponding to a standard heat resistance value of the first heat dissipation modules arranged on the uniform heat source. Afterwards, it is predicted whether the second heat dissipation modules arranged on the non-uniform heat source satisfy a test standard or not by using a test heat resistance value acquired by testing the second heat dissipation modules arranged on the uniform heat source.

7 Claims, 4 Drawing Sheets

METHOD FOR DETECTING PERFORMANCES OF HEAT DISSIPATION MODULES

CROSS-REFERENCE TO RELATED APPLICATIONS

This non-provisional application claims priority under 35 U.S.C. §119(a) on Patent Application No(s). 098140227 filed in Taiwan, R.O.C. on Nov. 25, 2010, the entire contents of which are hereby incorporated by reference.

BACKGROUND OF THE INVENTION

1. Field of the Invention

The present invention relates to a method for detecting heat dissipation modules, and more particularly to a high-accuracy method for detecting heat dissipation modules.

2. Related Art

In recent years, with the rapid progress of computer technology, the operating speed of the computer is continuously increased, and the heat generation rate of electronic elements in the computer also rises accordingly. In order to prevent the electronic elements in the computer from getting overheated to cause a temporary or permanent failure to the electronic elements, a heat dissipation module is placed in the computer in the prior art, so as to dissipate the heat generated by the electronic elements out of the computer.

In the electronic elements, a central processing unit (CPU) is a main heat generation source among the electronic elements of the computer. When the CPU is operating at a high speed, if the temperature of the CPU exceeds a normal working temperature range, a computing error may easily occur to the CPU, or the CPU is temporarily failed, resulting in a breakdown of the computer. In addition, when the temperature of the CPU far exceeds the normal working temperature range, transistors in the CPU may be easily damaged and cause permanent failure to the CPU.

Therefore, when the computers are manufactured, in order to ensure a normal operation of the heat dissipation module assembled in each manufactured computer so as to prevent the computers from failing or even being permanently damaged due to the damaged heat dissipation modules assembled therein, manufacturers of the computers need to check every heat dissipation module. As such, how to quickly and accurately measure performances of each heat dissipation module needs to be solved in the computer manufacturing field.

SUMMARY OF THE INVENTION

Accordingly, the present invention is a method for detecting performances of heat dissipation modules, so as to quickly and accurately measure performances of each heat dissipation module in the prior art.

The method for detecting performances of heat dissipation modules comprises the following steps. A plurality of first heat dissipation modules is provided. Heat resistance values of the first heat dissipation modules under a non-uniform heat source are measured. Heat resistance values of the first heat dissipation modules under a uniform heat source are measured. A corresponding relation between the heat resistance values of the first heat dissipation modules under the non-uniform heat source and the heat resistance values of the first heat dissipation modules under the uniform heat source is described through a linear equation. A target heat resistance value is set, in which the target heat resistance value represents the heat resistance values of the first heat dissipation modules under the non-uniform heat source. The target heat resistance value is substituted into the linear equation to acquire a corresponding standard heat resistance value, in which the standard heat resistance value represents the heat resistance values of the first heat dissipation modules under the uniform heat source. A plurality of second heat dissipation modules is provided, in which a structure of the second heat dissipation modules is the same as a structure of the first heat dissipation modules. The second heat dissipation modules are arranged on the uniform heat source, and a test heat resistance value of the heat dissipation modules under the uniform heat source is measured. The second heat dissipation modules having the test heat resistance value higher than the standard heat resistance value are marked.

According to other embodiments of the present invention, the first heat dissipation module has a fan.

According to other embodiments of the present invention, a rotation speed of the fan when the first heat dissipation module is pressed on the non-uniform heat source is the same as a rotation speed of the fan when the first heat dissipation module is pressed on the uniform heat source.

According to other embodiments of the present invention, a contact force of pressing the first heat dissipation module on the non-uniform heat source is the same as a contact force of pressing the first heat dissipation module on the uniform heat source.

According to other embodiments of the present invention, a contact force of pressing the first heat dissipation module on the uniform heat source is the same as a contact force of pressing the second heat dissipation module on the uniform heat source.

According to other embodiments of the present invention, a coefficient of determination of a regression analysis of the linear equation is greater than 0.8.

In view of the above, in the present invention, the corresponding relation between the heat resistance values of the first heat dissipation modules under the non-uniform heat source and the heat resistance values of the first heat dissipation modules under the uniform heat source is described through the linear equation. Therefore, before the second heat dissipation modules are tested, a calculation is performed with the linear equation, such that the target heat resistance value of the first heat dissipation modules arranged on the non-uniform heat source is corresponding to the standard heat resistance value of the first heat dissipation modules arranged on the uniform heat source. Afterwards, in the present invention, the second heat dissipation modules may be arranged on the uniform heat source, and the performances of the second heat dissipation modules when arranged on the non-uniform heat source are predicted by using the standard heat resistance value as a reference, thereby evaluating a quality of the second heat dissipation modules.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Generally, for a chip in a computing device, for example, a CPU or a graphics chip, the surface temperature thereof is non-uniformly distributed in operation. Therefore, in order to ensure that the heat generated by the chip during the operation can be successfully dissipated, a chip manufacturer usually fabricates several simulation chips according to a heat generation mode of the chip, in which each simulation chip has the same heat generation mode as the chip, but does not have the computing capability of the chip. The chip manufacturer then delivers the simulation chips to a computing device manufacturer, for example, an original equipment manufacturer (OEM) for assembling notebook computers.

In this manner, the computing device manufacturer may design heat dissipation modules in the computing device by using the simulation chips, so as to ensure that the heat generated by the chip can be successfully dissipated, thereby ensuring a normal operation of the computing device with the chip.

The OEM industry of notebook computers is set as an example. For a single machine type, the number of the notebook computers manufactured by the notebook computer manufacturer is up to millions. Therefore, generally, the number of the simulation chips provided by the chip manufacturer to the computing device manufacturer is quite small relative to the number of the computing devices in mass production. In this case, if the performances of the heat dissipation modules of each computing device are measured one by one by using the simulation chips so as to confirm that each heat dissipation module satisfies the design requirements, this detection manner may cost quite a long time. In other words, since the number of the simulation chips is quite small, the manner of detecting the heat dissipation modules one by one by using the simulation chips may result in low efficiency of detecting the heat dissipation modules and delay of the delivery schedule.

In order to prevent the above problems, in the present invention, the heat dissipation module is detected by using a heating block capable of uniformly generating heat. The heating block capable of uniformly generating heat is more simply fabricated as compared with the simulation chip, and is suitable for being manufactured in large quantities. Therefore, in the present invention, a plurality of heating blocks is easily manufactured, and the number of the heating blocks is much greater than the number of the simulation chips. As such, in terms of quantity, the heating blocks can be used at the same time to detect many heat dissipation modules as compared with the simulation chips, thereby improving the efficiency of detecting the heat dissipation modules. The present invention is described in detail below.

Figure 1:
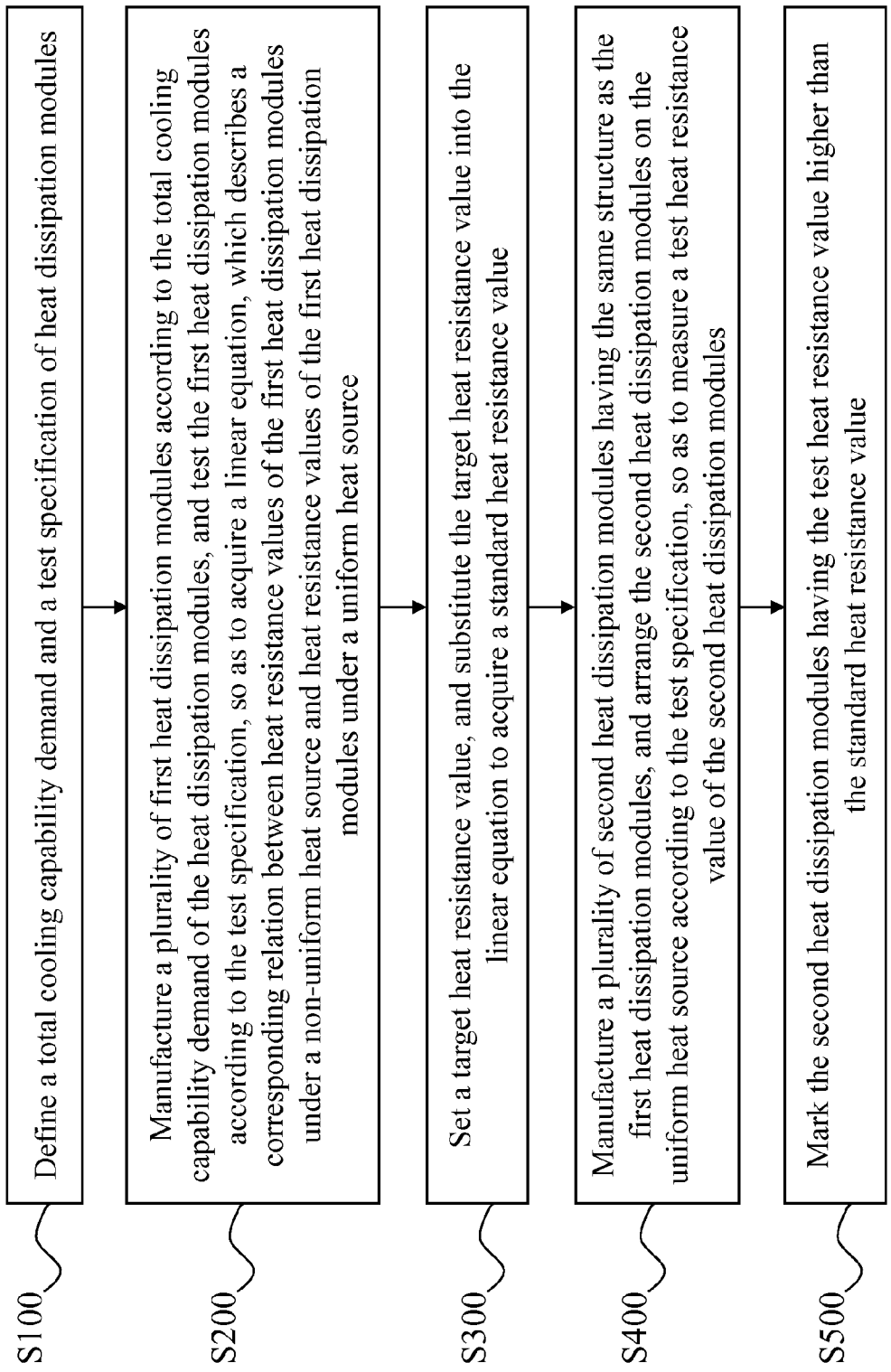
FIG. 1 is a flow chart of manufacturing a computing device according to an embodiment of the present invention.

FIG. 1 is a flow chart of manufacturing a computing device according to an embodiment of the present invention. Referring to FIG. 1, in Step S100, firstly, in this embodiment, a total cooling capability demand of heat dissipation modules is set, and a test specification of the heat dissipation modules is defined, in which the test specification of the heat dissipation modules comprises a contact force of pressing the heat dissipation module on a chip, a size of a heating block, and a specification and a rotation speed of a fan of the heat dissipation module. Next, in Step S200, a computing device manufacturer delivers the test specification and the total cooling capability demand of the heat dissipation modules defined in Step S100 to a heat dissipation module manufacturer. After receiving a capability demand request from the computing device manufacturer, the heat dissipation module manufacturer manufactures a plurality of first heat dissipation modules according to the total cooling capability demand of the heat dissipation modules, in which the first heat dissipation module has a fan for dissipating heat generated by the first heat dissipation module. Then, the heat dissipation module manufacturer samples the first heat dissipation modules and tests the sampled modules, in which, preferably, the number of the sampled first heat dissipation modules is greater than 30.

It should be noted that the above embodiment is not intended to limit that the first heat dissipation module of the present invention must have a fan. In other embodiments of the present invention, the test specification of the heat dissipation modules defined in Step S100 may not comprise the specification and the rotation speed of the fan of the heat dissipation module. Thereby, the first heat dissipation module manufactured by the heat dissipation module manufacturer may not have a fan.

Figure 2:
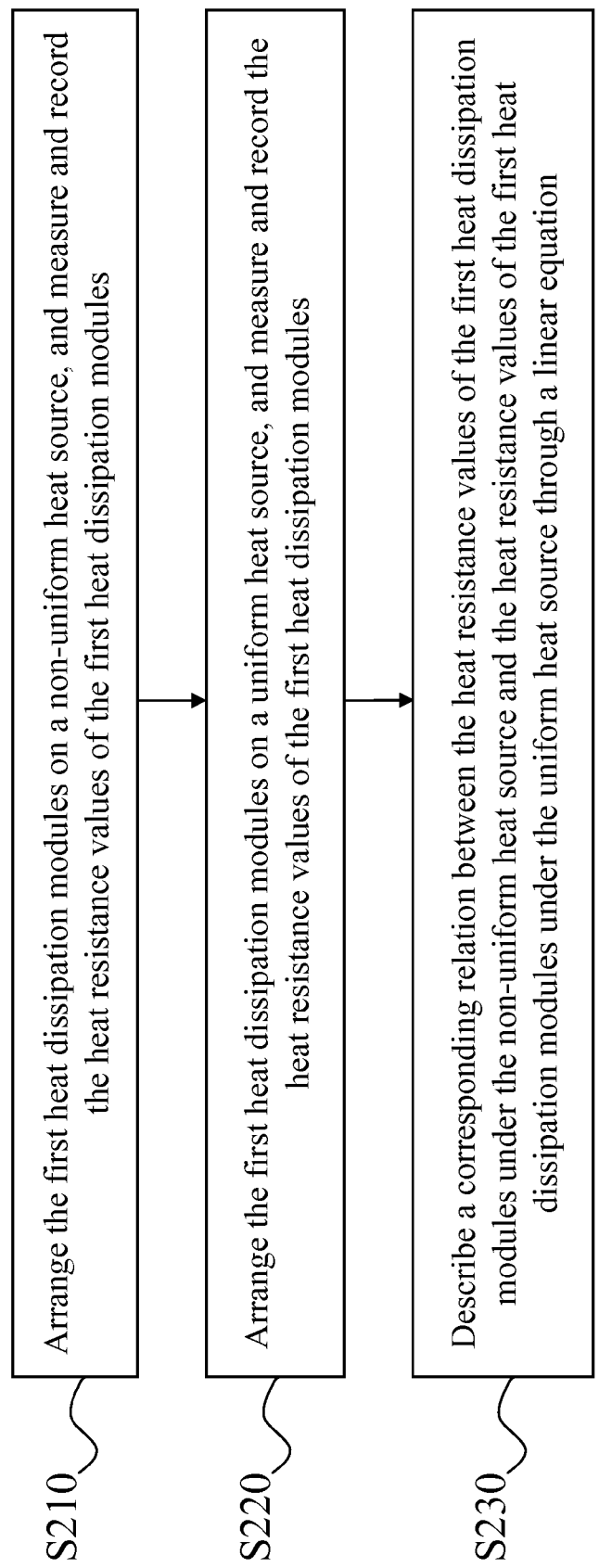
FIG. 2 is a flow chart of testing first heat dissipation modules according to the embodiment of FIG. 1.

The process of testing the first heat dissipation modules is described in detail below. FIG. 2 is a flow chart of testing the first heat dissipation modules according to the embodiment of FIG. 1. Referring to FIG. 2, firstly, in Step S210, the heat dissipation module manufacturer arranges the first heat dissipation module on the simulation chip, in which the first heat dissipation module is pressed on the simulation chip through the contact force defined in Step S100. In other words, the first heat dissipation module is arranged on a non-uniform heat source. Afterwards, the simulation chip is started to generate a first heat generation rate W1, and the fan of the first heat dissipation module operates at the rotation speed defined in Step S100, in which the first heat generation rate W1 is equal to a heat generation rate defined by the total cooling capability demand. Then, a heat resistance value of the first heat dissipation module is measured and recorded. In this embodiment, the heat resistance value is measured when the tested first heat dissipation module reaches a steady state. In other words, in this step, a steady-state heat resistance value of the first heat dissipation module is measured and recorded. The above step is repeated, so as to measure steady-state heat resistance values of the other sampled first heat dissipation modules.

Next, in Step S220, a heating block is provided. The heating block is a uniform heat source, and fabricated according to the size of the heating block in the test specification defined in Step S100. In this embodiment, the heating block comprises a copper block and a heating unit, and the heating unit is, for example, a heating rod or a ceramic heating plate. The heating unit is arranged in the copper block. The copper block has an excellent heat conductivity coefficient, such that the heat generated by the heating rod is uniformly delivered to every part of the copper block, and thus the temperature of each part of the copper block tends to be consistent. Since the temperature of each part of the copper block tends to be consistent, the structure of the heating block, in which the heating rod is inserted into the copper block, is considered as a uniform heat source. Next, the heat dissipation module manufacturer arranges the first heat dissipation module on the heating block, and the first heat dissipation module is assembled on the heating block according to the test specification of the heat dissipation modules defined in Step S100.

Preferably, before the first heat dissipation module is pressed to the heating block, the heating block is maintained at a first preset temperature, in which the preset temperature is higher than an ambient temperature around the heating block. Next, a heat output power of the heating block is maintained at a second heat generation rate, and the fan of the first heat dissipation module operates at the rotation speed defined in Step S100, in which the second heat generation rate is greater than the first heat generation rate. After a first preset time, the heat resistance value of the first heat dissipation module is measured and recorded. In this embodiment, the heat resistance value is measured before the temperature of the first heat dissipation module reaches the steady state. In other words, in this step, a transient-state heat resistance value of the first heat dissipation module is measured and recorded. The above step is repeated, so as to measure transient-state heat resistance values of the other sampled first heat dissipation modules.

Figure 3A:
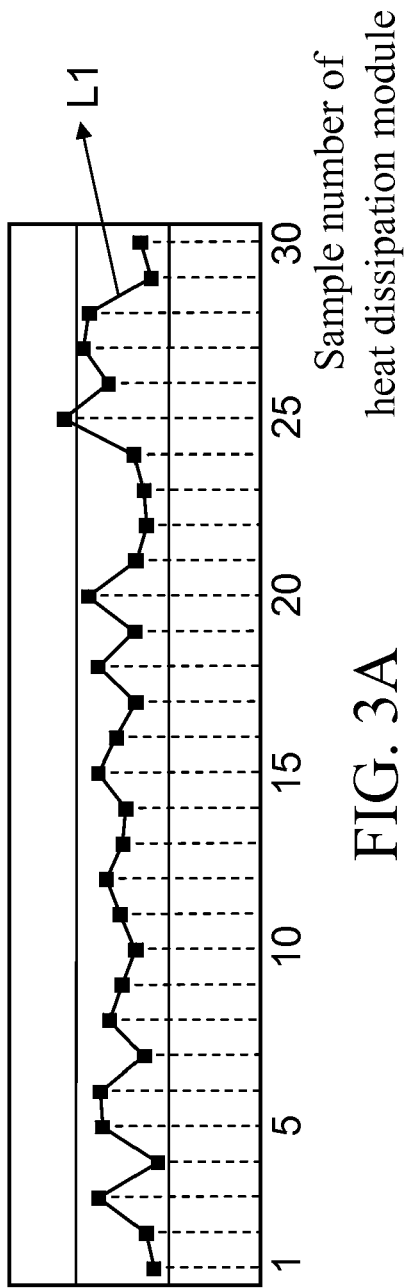
FIG. 3A is a schematic view of a curve formed by connecting a steady-state heat resistance value of each sampled first heat dissipation module, when the first heat dissipation modules are arranged on simulation chips.
Figure 3B:
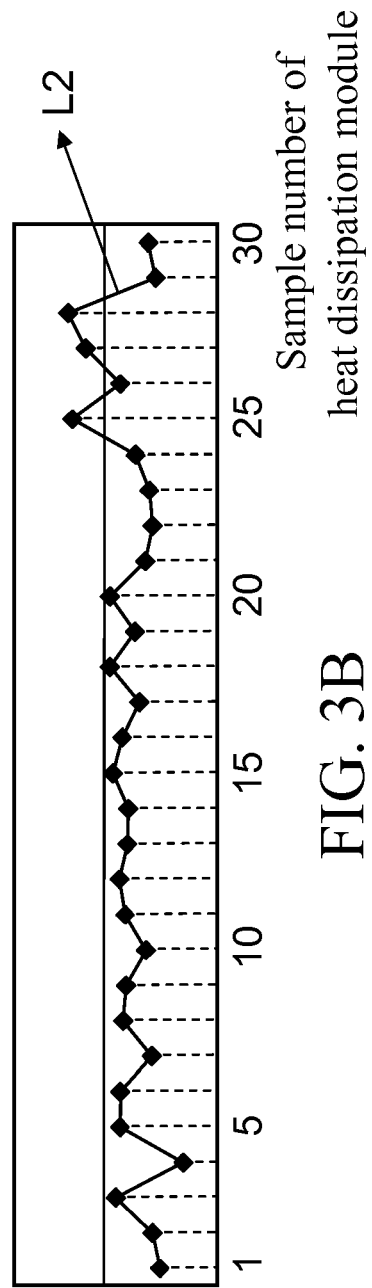
FIG. 3B is a schematic view of a curve formed by connecting a transient-state heat resistance value of each sampled first heat dissipation module, when the first heat dissipation modules are arranged on the simulation chips.

Next, in Step S230, a change trend of the steady-state heat resistance values of the first heat dissipation modules is compared with a change trend of the transient-state heat resistance values of the first heat dissipation modules. For example, FIGS. 3A and 3B are schematic views of curves of the heat resistance values of the first heat dissipation modules to sample numbers of the heat dissipation modules. In this embodiment, the change trend of the steady-state heat resistance values of the first heat dissipation modules is compared with the change trend of the transient-state heat resistance values of the first heat dissipation modules through FIGS. 3A and 3B. Referring to FIGS. 3A and 3B, a curve L1 in FIG. 3A represents a curve formed by connecting the steady-state heat resistance value of each sampled heat dissipation module, when the first heat dissipation modules are arranged on the simulation chips, and a curve L2 in FIG. 3B represents a curve formed by connecting the transient-state heat resistance value of each sampled heat dissipation module, when the first heat dissipation modules are arranged on the heating blocks. In FIGS. 3A and 3B, the same sample number of the heat dissipation module represents the same heat dissipation module. If the change trend of the steady-state heat resistance value of the heat dissipation module is different from the change trend of the transient-state heat resistance value of the module having the same sample number, test equipment or test conditions from Steps S210 to S230 need to be checked. After checking, if it is found that the test equipment cause an error or a test environment of a part of the heat dissipation modules is different from that of the remaining heat dissipation modules, in this embodiment, the test equipment are corrected or the test conditions of the heat dissipation modules are re-unified, for example, an area of the uniform heat source or a heating time is modified, or the contact force or a heating power is adjusted. Afterwards, Steps S210 to S230 are implemented again, such that the change trend of the steady-state heat resistance value of the heat dissipation module is similar to the change trend of the transient-state heat resistance value of the module having the same sample number.

Figure 4:
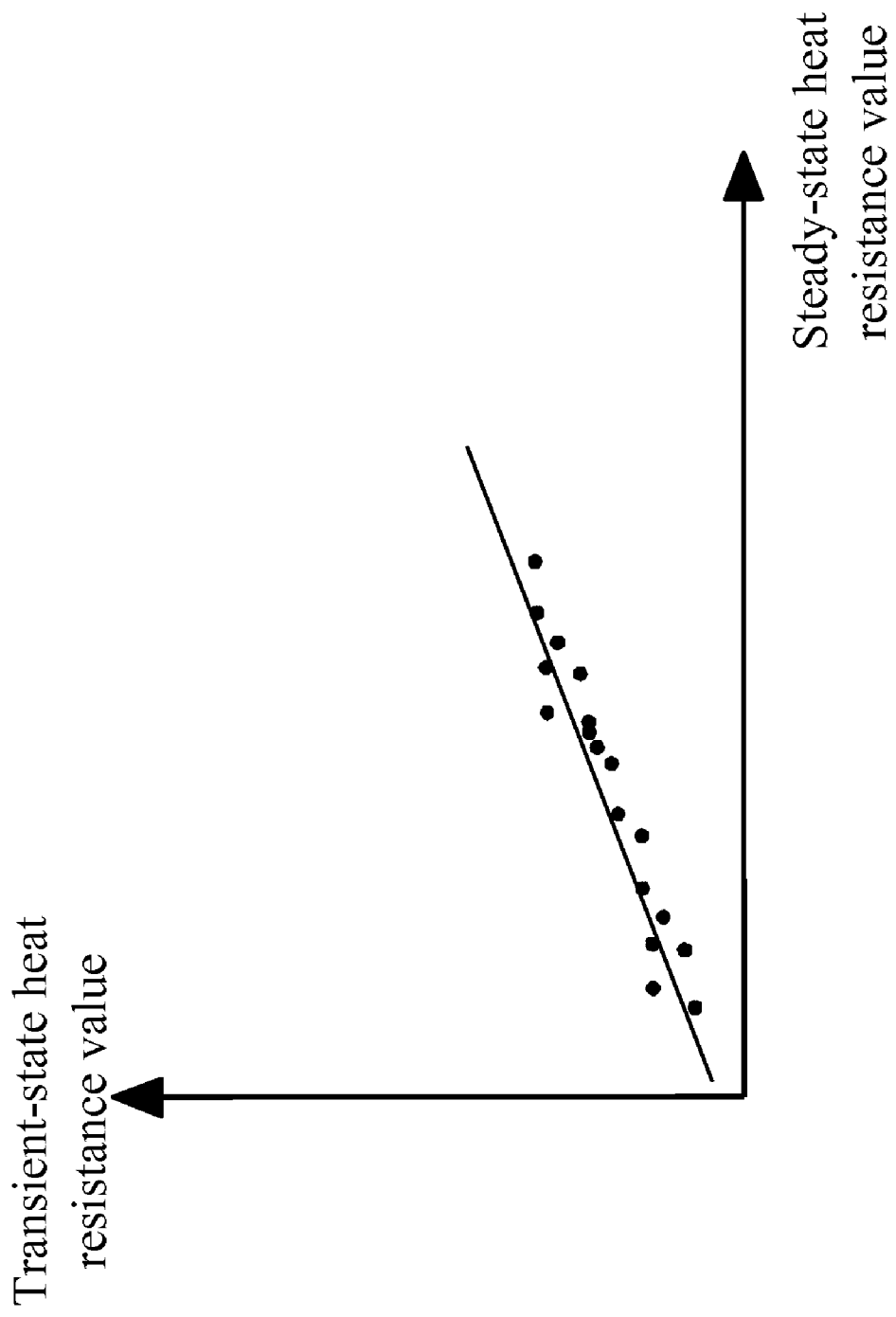
FIG. 4 is a schematic view of a corresponding relation between the steady-state heat resistance values and the transient-state heat resistance values in FIG. 3 described through a linear equation.

Referring to FIG. 4, it should be noted that in the above-mentioned "the change trend of the steady-state heat resistance value of the heat dissipation module is similar to the change trend of the transient-state heat resistance value of the module having the same sample number", the so-called "similar to" indicates that a corresponding relation between the steady-state heat resistance values of the sampled first heat dissipation modules on the simulation chips (i.e., under the non-uniform heat source) and the transient-state heat resistance values of the sampled first heat dissipation modules on the heating blocks (i.e., under the uniform heat source) is described through a linear equation, and a coefficient of determination ($R^2$) of a regression analysis of the linear equation needs to be greater than 0.8.

Further referring to FIG. 1, if the coefficient of determination of the regression analysis of the linear equation is greater than 0.8, Step S300 is performed. In Step S300, the heat dissipation module manufacturer delivers the linear equation and the test conditions in Steps S210 to S230 to the computing device manufacturer for acknowledgement. Afterwards, the computing device manufacturer sets a target heat resistance value, and the target heat resistance value represents the steady-state heat resistance values of the first heat dissipation modules on the simulation chips (i.e., under the non-uniform heat source). Then, the target heat resistance value is substituted into the linear equation to acquire a corresponding standard heat resistance value, and the standard heat resistance value represents the transient-state heat resistance values of the first heat dissipation modules on the heating blocks (i.e., under the uniform heat source).

Next, in Step S400, the heat dissipation module manufacturer manufactures a plurality of second heat dissipation modules. The number of the second heat dissipation modules is greater than the number of the first heat dissipation modules, and a structure of the second heat dissipation modules is the same as a structure of the first heat dissipation modules. The heat dissipation module manufacturer provides at least one heating block. The heat dissipation module manufacturer arranges the second heat dissipation module on the heating block, and the second heat dissipation module is assembled on the heating block according to the test specification of the heat dissipation modules defined in Step S100. Preferably, before the second heat dissipation module is pressed on the heating block, the heating block is maintained at a second preset temperature, and the second preset temperature is higher than an ambient temperature around the heating block. In this embodiment, the second preset temperature in Step S400 is the same as the first preset temperature in Step S220. A heat output power of the heating block is maintained at a second heat generation rate, and the second heat generation rate is greater than the first heat generation rate. After the second preset time and before the temperature of the second heat dissipation module reaches a steady state, a test heat resistance value of the second heat dissipation module is measured and recorded. In this embodiment, a length of the second preset time is equal to a length of the first preset time. The above step is repeated, so as to measure test heat resistance values of the remaining second heat dissipation modules.

Afterwards, in Step S500, the second heat dissipation modules having the test heat resistance value higher than the standard heat resistance value are marked. In this embodiment, the second heat dissipation modules having the test heat resistance value higher than the standard heat resistance value are marked as defective.

In view of the above, in the present invention, the corresponding relation between the heat resistance values of the first heat dissipation modules under the non-uniform heat source and the heat resistance values of the first heat dissipation modules under the uniform heat source is described through the linear equation. Therefore, a calculation is performed with the linear equation, such that the target heat resistance value of the first heat dissipation modules arranged on the non-uniform heat source is corresponding to the standard heat resistance value of the first heat dissipation modules arranged on the uniform heat source. Afterwards, the structure of the second heat dissipation modules is the same as the structure of the first heat dissipation modules, such that in the present invention, it is predicted whether the second heat dissipation modules arranged on the non-uniform heat source satisfy the test standard or not (that is, the steady-state heat resistance value of the second heat dissipation modules is smaller than or equal to the target heat resistance value) by comparing the test heat resistance value with the standard heat resistance value.

The chip (for example, the CPU or the graphics chip) installed in the computing device is quite expensive, and the number of the simulation chips provided by the chip manufacturer is quite small, so that if each heat dissipation module is tested with the chip or the simulation chips, the test cost is rather high for the computing device manufacturer or the heat dissipation module manufacturer. For example, it is assumed that the first heat dissipation module is in trial production stage, and the second heat dissipation module is in formal mass production stage. Therefore, since the number of the second heat dissipation modules to be produced in the formal mass production stage is usually quite large, if each second heat dissipation module is tested by using the aforementioned chip or the simulation chips, the test cost is rather high for the computing device manufacturer or the heat dissipation module manufacturer.

On the contrary, the uniform heat source (for example, the heating block) is inexpensive, and in the present invention, it is predicted whether the second heat dissipation modules arranged on the non-uniform heat source satisfy the test standard or not by using the test heat resistance value acquired by testing the second heat dissipation modules arranged on the uniform heat source, such that the second heat dissipation modules can be accurately tested one by one at a low cost.

In addition, in the above embodiment, the heat resistance value of the second heat dissipation module is measured before the temperature of the second heat dissipation module reaches the steady state, instead of being measured when the temperature of the second heat dissipation module reaches the steady state. In this manner, the second heat dissipation modules satisfying the test standard can be quickly found from the second heat dissipation modules by using the above measuring method.

What is claimed is:

1. A method for detecting heat resistance values of heat dissipation modules, comprising:
   providing a plurality of first heat dissipation modules;
   measuring heat resistance values of the first heat dissipation modules on a non-uniform heat source;
   measuring heat resistance values of the first heat dissipation modules on a uniform heat source;
   describing a corresponding relation between the heat resistance values of the first heat dissipation modules on the non-uniform heat source and the heat resistance values of the first heat dissipation modules on the uniform heat source through a linear equation;
   setting a target heat resistance value, wherein the target heat resistance value represents the heat resistance values of the first heat dissipation modules on the non-uniform heat source;
   substituting the target heat resistance value into the linear equation to acquire a corresponding standard heat resistance value, wherein the standard heat resistance value represents the heat resistance values of the first heat dissipation modules on the uniform heat source;
   providing a plurality of second heat dissipation modules, wherein a structure of the second heat dissipation modules is the same as a structure of the first heat dissipation modules;
   arranging the second heat dissipation modules on the uniform heat source, and measuring a test heat resistance value of the heat dissipation modules on the uniform heat source; and
   marking the second heat dissipation modules having the test heat resistance value higher than the standard heat resistance value.

2. The method according to claim 1, wherein a contact force of pressing the first heat dissipation module on the non-uniform heat source is the same as a contact force of pressing the first heat dissipation module on the uniform heat source.

3. The method according to claim 1, wherein a contact force of pressing the first heat dissipation module on the uniform heat source is the same as a contact force of pressing the second heat dissipation module on the uniform heat source.

4. The method according to claim 1, wherein a coefficient of determination of a regression analysis of the linear equation is greater than 0.8.

5. The method according to claim 1, wherein the first heat dissipation module has a fan.

6. The method according to claim 5, wherein a rotation speed of the fan when the first heat dissipation module is pressed on the non-uniform heat source is the same as a rotation speed of the fan when the first heat dissipation module is pressed on the uniform heat source.

7. A method for detecting heat resistance values of heat dissipation modules, comprising:
   providing a plurality of first heat dissipation modules, each of the heat dissipation module has a fan;
   measuring heat resistance values of the first heat dissipation modules on a non-uniform heat source;
   measuring heat resistance values of the first heat dissipation modules on a uniform heat source, wherein a rotation speed of the fan when the first heat dissipation module is pressed on the non-uniform heat source is the same as a rotation speed of the fan when the first heat dissipation module is pressed on the uniform heat source and a contact force of pressing the first heat dissipation module on the non-uniform heat source is the same as a contact force of pressing the first heat dissipation module on the uniform heat source;
   describing a corresponding relation between the heat resistance values of the first heat dissipation modules pressed on the non-uniform heat source and the heat resistance values of the first heat dissipation modules pressed on the uniform heat source, through a linear equation, wherein a coefficient of determination of a regression analysis of the linear equation is greater than 0.8;
   setting a target heat resistance value, wherein the target heat resistance value represents the heat resistance values of the first heat dissipation modules on the non-uniform heat source;
   substituting the target heat resistance value into the linear equation to acquire a corresponding standard heat resistance value, wherein the standard heat resistance value represents the heat resistance values of the first heat dissipation modules on the uniform heat source;
   providing a plurality of second heat dissipation modules, wherein a structure of the second heat dissipation modules is the same as a structure of the first heat dissipation modules;
   pressing the second heat dissipation modules on the uniform heat source, and measuring a test heat resistance value of the heat dissipation modules on the uniform heat source, wherein the contact force of pressing the first heat dissipation module on the uniform heat source is the same as a contact force of pressing the second heat dissipation module on the uniform heat source; and marking the second heat dissipation modules having the test heat resistance value higher than the standard heat resistance value.

* * * * *